(12) United States Patent
Hampp

(10) Patent No.: US 9,530,498 B2
(45) Date of Patent: Dec. 27, 2016

(54) OPTICAL DATA STORE AND METHOD FOR STORAGE OF DATA IN AN OPTICAL DATA STORE

(71) Applicant: Actilor GmbH, Leuna (DE)

(72) Inventor: Norbert Hampp, Amoeneburg-Rossdorf (DE)

(73) Assignee: Actilor GmbH, Leuna (DE)

( * ) Notice: Subject to any disclaimer, the term of this patent is extended or adjusted under 35 U.S.C. 154(b) by 362 days.

(21) Appl. No.: 14/173,038

(22) Filed: Feb. 5, 2014

(65) Prior Publication Data

US 2014/0177369 A1  Jun. 26, 2014

Related U.S. Application Data

(60) Division of application No. 12/645,297, filed on Dec. 22, 2009, now abandoned, which is a continuation of
(Continued)

(30) Foreign Application Priority Data

Dec. 21, 2001 (DE) .................................. 101 63 428

(51) Int. Cl.
*G11C 13/04* (2006.01)
*G11B 7/0055* (2006.01)
(Continued)

(52) U.S. Cl.
CPC ........... *G11C 13/041* (2013.01); *G11B 7/0055* (2013.01); *G11B 7/244* (2013.01); *G11B 7/245* (2013.01);
(Continued)

(58) Field of Classification Search
CPC ........ G11B 7/244; G11B 7/245; G11B 13/041
See application file for complete search history.

(56) References Cited

U.S. PATENT DOCUMENTS 5,228,001 A 7/1993 Birge
5,279,932 A 1/1994 Miyasaka
(Continued)

FOREIGN PATENT DOCUMENTS

DE 19914702 A1 5/2000
EP 1063645 A2 12/2000
WO 9405008 A1 3/1994

OTHER PUBLICATIONS

Tan et al. "Secure optical memory system with polarization encryption" Appl. Opt., May 2001, vol. 40, p. 2310-2315.*
(Continued)

*Primary Examiner* — Gerard Higgins
(74) *Attorney, Agent, or Firm* — Rothwell, Figg, Ernst & Manbeck, P.C.

(57) ABSTRACT

An optical data store is specified, having a data storage layer with a non-toxic and biodegradable polymer as light-sensitive storage medium which has photo-inducible anisotropy, for the induction of which a threshold value of the optical intensity has to be exceeded. The light-sensitive material is preferably bacteriorhodopsin which, by way of example, is immobilized in a manner embedded in a suitable matrix material or, if appropriate, in a crosslinked manner. The storage medium permits a high storage density and can be applied in a simple manner, for instance by printing onto a substrate.

16 Claims, 1 Drawing Sheet

Related U.S. Application Data application No. 10/499,439, filed as application No. PCT/EP02/14681 on Dec. 20, 2002, now Pat. No. 7,722,941.

(51) Int. Cl.

| | | |
|---|---|---|
| *G11B 7/244* | (2006.01) | |
| *G11B 7/245* | (2006.01) | |
| *G11B 7/2539* | (2013.01) | |
| *G11B 20/10* | (2006.01) | |

(52) U.S. Cl.
CPC ............. *G11B 7/2539* (2013.01); *G11B 20/10* (2013.01); *Y10T 428/21* (2015.01)

(56) References Cited

U.S. PATENT DOCUMENTS

| | | |
|---|---|---|
| 5,346,789 A | 9/1994 | Lewis |
| 5,374,492 A | 12/1994 | Hampp et al. |
| 5,470,690 A | 11/1995 | Lewis |
| 5,543,267 A | 8/1996 | Stumpe |
| 5,641,846 A | 6/1997 | Bieringer |
| 5,757,525 A | 5/1998 | Rao |
| 6,140,012 A | 10/2000 | Smithey |
| 6,274,279 B1 | 8/2001 | Hampp et al. |
| 6,284,418 B1 | 9/2001 | Trantolo |
| 6,512,085 B1 | 1/2003 | Minabe |
| 6,616,964 B1 | 9/2003 | Hampp et al. |
| 7,722,941 B2 | 5/2010 | Hampp |

OTHER PUBLICATIONS

Okada et al. "polarization properties in phase conjugation with bacteriorhodopsin" Jpn. J. Appl. Phys., 1993, vol. 32, p. 3728-3832.*

Zhou et al. "Beam deflectors and spatial light modulators holographic storage application" in "Holographic Data Storage" edited by Coufal et al., Springer, 2000, p. 241-257.*

Brauchle, C. et al. "Optical Processing and Storage with Bacteriorhodopsin", Proc. SPIE 1993, 1852, 238-242.

CRC Handbook of Chemistry and Physics, 2011, 91st Ed., p. 13-6 to 13-12. Acquired from http://www.hbcpnetbase.com/.

D'Cruz, N. et al. "Thermal Unfolding of Gelatin in Solids as Affected by the Glass Transition", J. of Food Science E: Food Engineering and Physical Properties 2005, 70, p. E64-E68.

Hampp, "Bacteriorhodopsin as a photochromic retinal protein for optical memories", Chemical Reveiws, American Chemcial Society, vol. 100, No. 5, 2000, pp. 1755-1776.

Jaaskelainen, T. et al., "The Photochromic Properties of 4-keto Bacteriorhodopsin", Opt. Mat. 1996, 6, p. 339-345.

Quarterly Reviews of Biophysics, vol. 24, No. 4, 1991, pp. 425-478.

Tan et al., "Secure optical memory system with polarisation encryption", Applied Optics', vol. 40, No. 14, 2001.

Vsevolodov et al., "Some Methods for Irreversible Write-Once Recording in 'Biochrom' Films", Inst. of Biol. Phys., Acad. of Sci., Pushchino; USSR Images of the Twenty-First Century, Proceedings of the Annual International Conference of the IEEE Engineering in Medicine and Biology Society (Cat. No. 89CH2770-6) 1989, p. 1.

* cited by examiner

OPTICAL DATA STORE AND METHOD FOR STORAGE OF DATA IN AN OPTICAL DATA STORE

CROSS REFERENCE TO RELATED APPLICATIONS

This patent application is a divisional of U.S. Ser. No. 12/645,297 filed Dec. 22, 2009, which is a continuation of and claims priority to U.S. patent application Ser. No. 10/499,439, filed on Dec. 16, 2004, now U.S. Pat. No. 7,722,941 issued May 25, 2010, which is a 35 USC §371 National Phase Entry Application from PCT/EP02/14681, filed Dec. 20, 2002, and designating the U.S., which claims priority to DE 10163428.5 filed Dec. 21, 2001, the contents of each of which are hereby incorporated by reference.

DESCRIPTION

The invention relates to optical data stores and to methods for storage of data in a relevant optical data store.

In the technical field of information processing, optical data storage is growing in importance, as can be demonstrated using the example of CD-R. In documents, e.g. credit cards etc., a magnetic strip is usually used as storage medium. Memory chips in plastic cards are increasingly being used as well. Cash cards or the like with an optical storage medium have already been disclosed as well.

One disadvantage of the known storage media is that in some instances they do not have a particularly high storage capacity and/or are produced from materials which pose disposal problems after the data stores have been taken out of service.

In respect of one aspect, it is an object of the invention to specify a data store which can be realized with a high storage capacity and can be disposed of in an environmentally friendly manner without a particular outlay.

In respect of a further aspect, it is an object of the invention to specify an optical storage medium which is readily integrated into documents, is realized with a comparatively high storage capacity and has advantageous properties with regard to the possibilities of data recording.

In order to achieve the objects, the invention proposes an optical data store containing a data storage layer which contains a light-sensitive material made of an organic or biological polymer which is non-toxic and biodegradable, the data storage layer having photo-inducible, in particular non-reversible anisotropy, for the induction of which a threshold value of the optical intensity has to be exceeded.

In a preferred embodiment, the data storage layer comprises, as light-sensitive material, bacteriorhodopsin which, if appropriate, is embedded in a suitable matrix material and has photo-inducible, in particular non-reversible anisotropy, for the induction of which a threshold value of the optical intensity has to be exceeded.

An alternative biological polymer to bacteriorhodopsin is e.g. the photo-active yellow protein (PYP).

The present invention departs from the prior practice of using toxic materials or materials that are questionable in respect of disposal aspects as storage medium. The storage medium that is used according to the invention is a non-toxic and biodegradable, organic or biological polymer which can be permanently applied to a carrier substrate, e.g. paper, for example by means of a conventional application method such as, for instance, printing, spraying, pouring, inkjet application or the like. This results in a data storage layer or a film in which the photo-active polymer is immobilized.

The action of light with an optical intensity which exceeds the threshold value makes it possible to bring about the effect of photo-induced anisotropy, i.e. the absorption and/or the refractive index become dependent on direction. This effect is non-reversible under normal conditions and is therefore suitable for permanent storage of information. Since an intensity threshold has to be exceeded for the data storage operation, which intensity threshold can normally only be reached with a laser, the optical store can readily be exposed to daylight without the storage content being changed, to be precise even when a color change in the store is brought about in the case of photochromic material. In a preferred embodiment, the store according to the invention is a WORM store. Prototypes of the store have already reached a storage density of more than 1 Mbit of data on an area of 6 cm$^2$. An increase by several orders of magnitude is possible, if necessary.

It is particularly preferable to use a bacteriorhodopsin as light-sensitive material with photo-inducible permanent anisotropy for optical data stores according to the present invention. BR is a crystalline retinal protein which occurs in halobacteria. On account of its unusual photochemical properties and the fact that this protein has astonishing stability with respect to thermal and chemical destruction, scientists have already been occupied for quite a while with the possibility of making technical use of this material, preferably in optics. A first device based on BR was developed some time ago, BR, embedded in thin plastic films, serving as a short-term store for optical information in said device. For more than a decade, efforts have been made to establish storage of data for a longer time. The present invention has now achieved this.

A preferred embodiment of the store utilizes a bacteriorhodopsin with a lengthened lifetime of the so-called M state. As a result, bacteriorhodopsin's pronounced photochromism, which can generally be detected with the naked eye, is combined with the use as optical data store as described here. Optionally, the M state can also be utilized for data storage with blue light above a threshold value of the intensity.

The combination—specified here—of conventional photochromism of suitable bacteriorhodopsins and the possibility for data storage is advantageous in order, e.g. in terminals, to make it easier to find such a data store on a document. From an image comparison before and after exposure with an intensity insufficient for the storage operation, the photochromic region is identified by forming the difference between the two images.

Bacteriorhodopsin in purple membrane form has proved to be particularly suitable and comparatively economic to procure. In nature, BR is a crystal protein in the form of so-called purple membranes. These membrane sheets are only about five nanometers thick, which corresponds to $\frac{1}{100}$ of a light wavelength, have an irregular form and on average are 500 to 1000 nm in diameter. In this form, BR is so stable that it can even be hot-laminated at far in excess of 100° C.

In accordance with a preferred embodiment of the invention, bacteriorhodopsin in purple membrane form is accordingly used as light-sensitive material in the storage layer, said bacteriorhodopsin being immobilized by matrix embedding and/or crosslinking.

In a special embodiment of the invention, the light-sensitive material contains a bacteriorhodopsin variant with a lengthened K lifetime in comparison with the wildtype. This permits a lowering of the threshold energy for the optical intensity which has to be exceeded in order to achieve the anisotropy.

Also appropriate is a bacteriorhodopsin variant with a mutation in the retinal binding site, so that the retinal is no longer bound. This reduces the formation of retroretinals which arise in small quantities, in particular in the event of the threshold intensity being considerably exceeded.

In accordance with one embodiment of the invention, the light-sensitive material comprises a bacteriorhodopsin variant in which the natural retinal molecule is replaced by a synthetic variant. This makes it possible to achieve shifts in the optimum wavelength for data recording.

In a further embodiment, the light-sensitive material comprises a bacteriorhodopsin variant which can be identified by an amino acid sequence that marks it. Said amino acid sequence is a security feature which can be used for coding specific information. As a result, it is possible e.g. to identify a production batch of the material, which is/may be of importance in applications in the area of security, e.g. in passports, etc.

Suitable photochromic materials may be used as materials having photo-inducible anisotropy for realizing the data storage layers. This has the advantage that storage areas that have already been written to can easily be identified by the resulting color change.

The storage of data in the data storage layer is preferably effected with light of different states of polarization, in order to be able to exhaustively utilize the flexible possibilities of the photo-inducible anisotropy of the data storage layer. Thus, binary data may be recorded with light of two different states of polarization, in particular with linearly polarized light. Mutually perpendicular directions of polarization of linearly polarized light are expediently utilized as different states of polarization. The recording light source employed is preferably a pulsed laser which is able to provide the recording light with an optical intensity that exceeds the threshold value.

The stored information is expediently read out using polarization-selective optical means and a light having a significantly lower optical intensity than the recording light.

The optical data store may have a substrate which is transparent at least in regions and carries the data storage layer in a transparent region, if data are subsequently intended to be read out by means of an optical transmitted light arrangement and thus under the conditions of irradiation through the storage layer.

In accordance with a preferred embodiment, the storage layer is applied on a diffusely reflective substrate or substrate region, e.g. paper, plastic or the like. In the case of such data stores, the read operation is preferably carried out with light within the absorption bands of the light-sensitive material, that is to say preferably of the bacteriorhodopsin, in order to be able to compensate for the polarization properties that are completely or partly lost on account of the reflection of the read light at the substrate.

In accordance with a further embodiment of the invention, a specularly reflective layer is fitted between storage layer and substrate. In order to be able to improve the read-out in reflection, it is advantageous to fit a mirror layer behind the storage layer. This may be effected e.g. by vapor-depositing metal on a polymer film. This polymer film with its metal vapor-deposition may have a further function, if appropriate. It may itself likewise be used as an optical store, but one which is not anisotropic.

The optical data store according to the invention can be integrated e.g. into documents, for instance into passes, credit cards, etc., and be applied in a very simple manner, for instance by printing on.

A further aspect is that the light-sensitive material of the storage layer may be embedded in a matrix material whose softening point lies below the destruction threshold of the storage layer and which can be heated above the softening point for the purpose of erasing the stored information, e.g. by means of IR radiation or microwave radiation. The softening of the matrix material influences the storage layer in such a way that previously stored information "blurs" so diffusely that it can no longer be interpreted. An erasure operation is thus present. The optical data store can then also be written to and erased repeatedly again in the manner indicated above utilizing photo-inducible anisotropy.

If this possibility is not intended to be afforded, then it is possible, in the case of an optical data store according to the invention, for the light-sensitive material to be embedded in a matrix material whose softening point lies above the destruction threshold of the storage layer. The heating of the data store up to the softening point of the matrix material then automatically leads to the destruction of the storage layer. Consequently, a manipulation of the originally stored data in the sense of falsification cannot take place.

Particular importance in the context of the present invention is accorded to a method for storage of data and encryption thereof in a data store, the data store preferably having in the sense described above, as storage medium, a light-sensitive material having photo-inducible anisotropy, for the induction of which a threshold value of the optical intensity has to be exceeded. In the method, binary data are recorded with light of two different states of polarization, in particular linearly polarized light, preferably mutually perpendicularly linearly polarized light, a first data record being entirely or partly overwritten with a second data record, and the first data record thus being encrypted.

This encryption method is explained in more detail below with reference to the following table 1.

TABLE 1

| Write and encryption operation | | | | | | | | | |
|---|---|---|---|---|---|---|---|---|---|
| 1st Data record | 1 | 0 | 1 | 1 | 0 | 1 | 0 | 0 | 1 |
| Write polarizations | ↑ | → | ↑ | ↑ | → | ↑ | → | → | ↑ |
| 2nd Data record | 1 | 1 | 0 | 1 | 1 | 0 | 0 | 1 | 1 |
| Write polarizations | ↑ | ↑ | → | ↑ | ↑ | → | → | ↑ | ↑ |
| Resulting information | ↑ | ○ | ○ | ↑ | ○ | ○ | → | ○ | ↑ |
| Read and decoding operation (unauthorized) | | | | | | | | | |
| Reading of the data | ↑ | ○ | ○ | ↑ | ○ | ○ | → | ○ | ↑ |
| Interpretation without a key (*1) | 1 | ? | ? | 1 | ? | ? | 0 | ? | 1 |
| Read and decoding operation (authorized) | | | | | | | | | |
| Reading of the data | ↑ | ○ | ○ | ↑ | ○ | ○ | → | ○ | ↑ |
| Interpretation without a key | ↑ | ? | ? | 1 | ? | ? | 0 | ? | 1 |
| Use key (2nd data record) | 1 | 1 | 0 | 1 | 1 | 0 | 0 | 1 | 1 |
| Decrypted information (1st data record) | 1 | 0 | 1 | 1 | 0 | 1 | 0 | 0 | 1 |

(*1) 5 bits, which are unknown, already produce $2^5$ possibilities = 32. It is easy to see that as the key length increases, the code can assume an arbitrary complexity.

A definition is implemented, e.g. such that the binary number 1 is represented by a write polarization "↑" and the binary number 0 is represented by a write polarization "→".

A first data record, represented by a binary number sequence, is stored in the data store with light having a sufficient intensity, using the polarization assignment implemented. Afterward, a second data record is stored bit by bit at the same places as the first data record, i.e. the first data record is overwritten with the second data record, but without erasing the first data record in the process. At each storage location, the information resulting from the write operations for the first and second write operation are present in superposed fashion and are inseparable. Moreover, it is also not possible to identify what information resulted from the first write operation and what information resulted from the second write operation. At all locations at which the first and second data records have identical values, i.e. 0 or 1, the associated numerical value is discernible since both data records have the same value at this place. At all locations at which the first and second data records have different values, i.e. 0 and 1, the associated numerical value is no longer discernible. Since an item of information has been written at such a storage location with two mutually orthogonal polarizations, although it is discernible that an item of information is present there (this results from the accompanying absorption changes in the BR), it cannot be identified whether the 0 or the 1 belongs to the first data record. The first data record thus encrypts the second data record, and vice versa. Only someone in possession of the information for one of the two data records can read out the other data record. This results from the fact that, at each location containing both a 1 and a 0, the respective correct information can be obtained when one of the two data records is known, since the value of the other data record at this place is then the complementary value. The two data records (first and second) have equal authorization. It is thus possible to encrypt data, and the key may be exactly as long as the stored data themselves. This is a fundamental advantage over encryption methods in which only a short coding sequence is used, e.g. the pin code of IC-containing cards. If the pin code has become known, all the information is available. In the claimed case, even upon partial discovery of the key, e.g. the second data record, only the information corresponding to the place disclosed can be read. In another embodiment, different keys can be defined for different areas of the information. Said keys could be structured in blocks or, alternatively, hierarchically. One example of this might be e.g. patient data of the store owner. All personal identification information which is absolutely necessary for a physician giving treatment in an emergency, e.g. medicaments currently being taken, blood group, allergies, etc., could be stored without encryption. Further-reaching data, e.g. individual examination findings, x-ray images, etc., could be protected by encryption. These data are accessible only when the owner of the store discloses the information for decryption. Once again, only the information which has been coded with this key can then be read. Other data stored on the same store, e.g. bank accounts, etc., would not be accessible to the physician giving treatment, since a further key is necessary for this information.

This method according to the invention can also be used to erase data that have been recorded without encryption, that is to say to make said data unreadable. If this is the aim, each storage location would be overwritten with the information complementary to the stored information and the anisotropy would thus be destroyed at all locations. Thus, information can no longer be read out; it is only possible to establish that this location has been written to.

Particular importance in the context of the invention is also accorded to a method for storing data in an optical data store of the type explained above, the data store having, as storage medium, a light-sensitive material, preferably bacteriorhodopsin, which exhibits photo-induced anisotropy, for the induction of which a threshold value of the optical intensity has to be exceeded. An essential special feature of the method is that more than two different states of polarization per storage location are used during the recording of data in the storage layer. This permits a significant increase in the information density in the storage layer or a "grey-scale value" gradation. Note the following in this respect:

The storage medium that has not been written to is essentially optically isotropic. For each direction of polarization of the write light, chromophores are available at one and the same place. It is thus possible to use write light of different states of polarization, e.g. linearly polarized light of different orientation, at two adjacent places and an information recording is obtained at both places, but with different orientation of the anisotropy. The different angles of the induced anisotropy can be used for representing information. This permits the representation not only of a binary number at a storage location, but the representation of a complex or higher-valued number. This will be explained using an example.

The hexadecimal number sequence 8A3C02F7 is to be stored. Each hexadecimal number is allocated a storage location. The direction of polarization of the write light at the individual storage places is set in accordance with the following Table 2.

TABLE 2

| Hexadec. number | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| Angle *1 [deg] | 0 | 6 | 12 | 18 | 24 | 30 | 36 | 42 | 48 | 54 | 60 | 66 | 72 | 78 | 84 | 90 |

*1 The angle relates to a zero position to be defined as desired.

The following representation thus results for the storage of the hexadecimal number specified:

TABLE 3

| Hexadec. Number sequence | | | | | | | |
|---|---|---|---|---|---|---|---|
| 8 | A | 3 | C | 0 | 2 | F | 7 |
| Angle 48 | 60 | 18 | 72 | 0 | 12 | 90 | 42 |

The setting of the direction of polarization of the preferably linearly polarized write light can be carried out e.g. by means of a lambda/2 plate mounted in rotatable fashion.

When reading the information, the locations written to are sought, the axis of the anisotropy is then determined and the information is reconstructed therefrom using the rules described above.

In this way, it is possible to store more than one information bit (multiplexing) at a memory place, e.g. a hexadecimal number, grey-scale values, etc.

Moreover, it is possible in this way to store halftone images in the data store, which images can be observed directly as so-called grey-scale value images with the aid of a polarization filter. A direction of polarization is defined for each grey-scale value, and they produce the corresponding brightness value when the data store is viewed (irradiated through) with preferably linearly polarized light.

In respect of a further aspect, the invention relates to a method for parallel recording of data blocks in an optical data store of the type explained above, which has, as storage medium, a light-sensitive material which has photo-induced anisotropy, for the induction of which a threshold value of the optical intensity has to be exceeded. The method is characterized in that the recording light is modulated according to the data block that is respectively to be recorded, in particular by means of a controllable surface light modulator (SLM), and the modulated recording light is focused toward the optical data store so intensely that its intensity in the storage layer exceeds the intensity threshold required for recording.

With regard to the data store according to the invention and with regard to the possibility of recording data by means of different states of polarization of the light, a further advantage that must be emphasized is that the data store does not have to be formatted prior to recording. This is explained as follows:

If the 0 is represented in a data store by the fact that it has not been altered, then the data store has to be formatted in order that it is possible to distinguish between a location which is in the original state as a result of production and a location which is in the original state because this represents an item of information, e.g. a 0. For this purpose, conventional optical data stores are formatted, i.e. have written to them a pattern which impresses on the data store an organization of its storage areas. If the intention is to achieve high storage densities, these structures have to be appropriately detailed. As soon as a read or write device is to be used, it must be adjusted to these fine structures, that is to say be correspondingly precise. This necessitates a corresponding technical outlay and thus corresponding high costs.

In the case of the store according to the invention, each information recording, that is to say including that of the 0, can be represented by a write operation and a corresponding change in the storage medium. Thus, the fact of which areas contain data can be identified without prior information during the read operation.

It should be added quite generally that in the storage of data in the data store according to the invention, it is possible to achieve an improvement in efficiency, that is to say a reduction of the quantity of light required, if the storage layer is cooled for a short time for the purpose of writing the data. The temperature can then be increased again.

The storage operation has hitherto been described in a context with the use of polarized light. In a less preferred variant of the invention, it is possible, as an alternative, to effect recording with non-polarized light, but this only enables binary data processing and, moreover, does not permit the encryption mechanism explained above.

A few aspects of the invention are explained in more detail below with reference to the figures.

Figure 1:
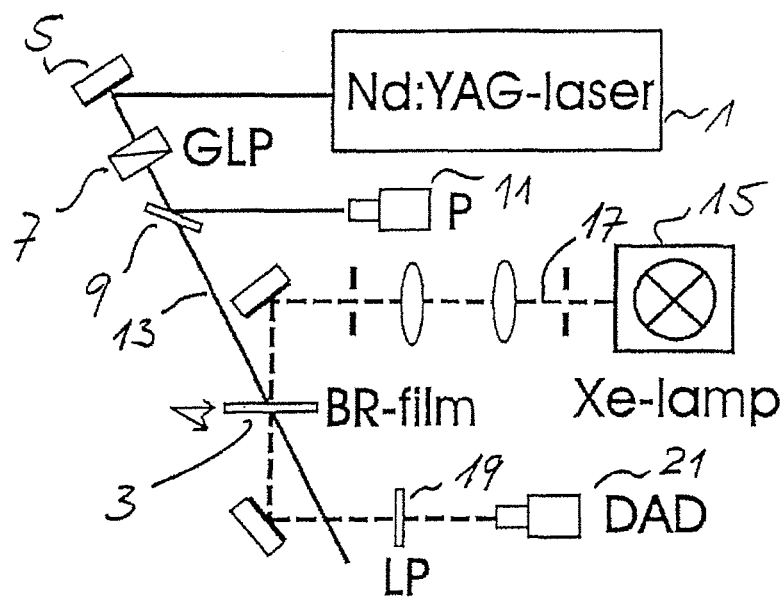
FIG. 1 shows an experimental set up for storage and reading of information in an optical data store according to the invention, or for demonstration of the functional principle of the invention and for analysis of the thermally stable, photo-induced anisotropy in the data storage layer (here a bacteriorhodopsin film).

In FIG. 1, the recording light source that is provided is a frequency-doubled Nd:YAG laser 1, which emits light pulses having a duration of approximately 3 ns, the intensity of which suffices for exceeding the threshold value for induction of the photo-inducible anisotropy of the storage layer 3 (here bacteriorhodopsin film). The laser light, after deflection at the mirror 5, passes through a polarizer 7, which ensures a precise linear polarization of the laser light. A partial beam is coupled out by means of the beam splitter 9 in order to measure the laser power by means of the power measuring device 11. This power measurement is an experimental measure. The main beam of the laser that passes through the beam splitter 9, passes through the storage layer 3 and, at the place where it passes through, brings about the effect of the photo-induced anisotropy of the light-sensitive material of the storage layer 3. The optical data store represented by the storage layer 3 can be displaced in two dimensions relative to the direction of the main beam 13 in order optionally to address different storage places of the storage layer. As an alternative, this could also be effected by a scanner that deflects the main beam 13 in a controlled manner.

In order to monitor the spectral changes in the storage layer or in order to read out the data written, the experimental setup in accordance with FIG. 1 is provided with a broadband light source, namely a collimated xenon lamp 15, the beam 17 of which, running at a small angle with respect to the laser beam 13, passes through the storage layer 3 and is then directed through the linear polarizer 19 to a diode array detector 21 (data reading detector). The linear polarizer 19 serves for the selection of the read-out light of the xenon lamp 15 that is polarized parallel to the polarization of the laser beam 13 or of the read-out light of the xenon lamp 15 that is polarized perpendicular to the polarization of the laser beam 13. The experimental setup according to FIG. 1 is suitable, in the version illustrated, for serial storage of data in the storage layer 3.

Figure 2:
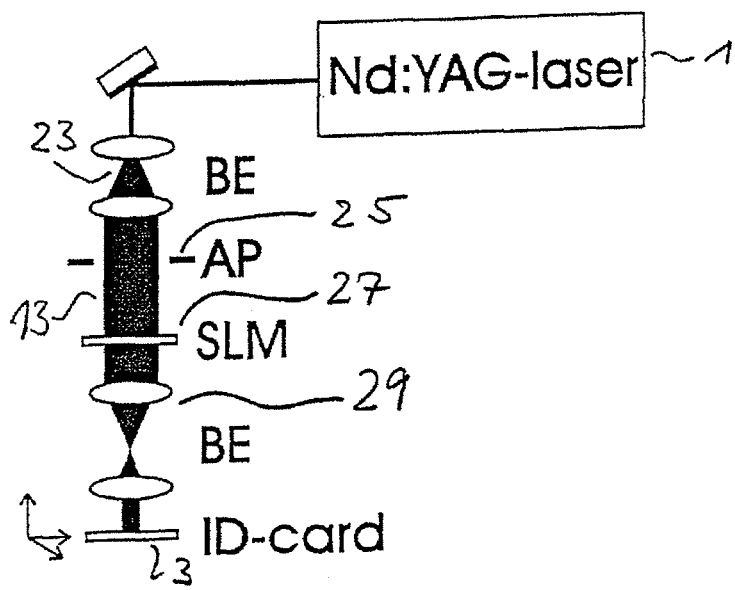
FIG. 2 shows an optical setup for parallel recording of data blocks in an optical data store according to the invention.

FIG. 2 shows an optical setup for parallel recording or storage of data blocks in a storage layer 3 of an optical data store according to the invention. The beam of the pulsed Nd:YAG laser 1 is expanded using a beam-expanding optical device 23. The expanded beam 13 passes through an aperture 25 and is then guided through a surface light modulator 27 to a focusing optical device 29. The surface light modulator 27 represents a controllable "light valve matrix", which may be, by way of example, a liquid crystal matrix having e.g. 320×264 pixels. The modulator 27 thus modulates the beam 13, which is expanded and therefore has relatively low intensity per unit area, according to the data block that is currently to be stored in parallel. The states of polarization are set by means of the modulator 27 in accordance with the binary states of the data bits to be stored. By means of the focusing optical device 29, the modulated beam is then focused toward the storage layer 3, so that a corresponding pixel spacing of e.g. 10 µm is achieved there. On account of the focusing, at the places of exposure, the beam 13 in the storage layer reaches an intensity which exceeds the threshold value for initiating the photo-induced anisotropy so that the data writing operation can be effected.

The invention claimed is:
1. A method of storing and erasing data comprising the steps of:
providing an optical data store containing a data storage layer comprising a light sensitive material, wherein the light-sensitive material is embedded in a matrix material, the matrix material having a softening point that lies below a threshold temperature at which the data storage layer is destroyed, wherein the data storage layer has photo-inducible non-reversible anisotropy, wherein the induction of said photo-inducible non-reversible anisotropy requires a threshold value of the optical intensity to be exceeded;

writing data to the optical data store by inducing the photo-inducible non-reversible anisotropy using a recording light having an optical intensity exceeding the threshold value; and heating the matrix material to a temperature above the softening point so as to erase the data by diffusely blurring the data during the heating step.

2. The method of storing and erasing data as claimed in claim 1, wherein the light-sensitive material contains bacteriorhodopsin.

3. The method of storing and erasing data as claimed in claim 1, wherein the light-sensitive material is a photochromic material.

4. The method of storing and erasing data as claimed in claim 1, wherein the matrix material is heated by infrared radiation.

5. The method of storing and erasing data as claimed in claim 1, wherein the matrix material is heated by microwave radiation.

6. The method of storing and erasing data as claimed in claim 1, comprising:
recording binary data using light of two different states of polarization; and
entirely or partly overwriting a first data record with a second data record, thereby encrypting said first data record.

7. The method of storing and erasing data as claimed in claim 6, wherein more than two different states of polarization per storage location are used at least in regions of the data store.

8. The method of storing and erasing data as claimed in claim 6, wherein the light is linearly polarized light.

9. The method of storing and erasing data as claimed in claim 1, wherein said light-sensitive material is an organic or biological polymer which is non-toxic and biodegradable.

10. The method of storing and erasing data as claimed in claim 1, comprising modulating the recording light according to respective data blocks to be recorded by means of a controllable surface light modulator (SLM), and focusing the modulated recording light toward the optical data store so that its intensity in the data storage layer of the optical data store exceeds an intensity threshold required for recording, so as to record data blocks in the optical data store in parallel.

11. A method of erasing data comprising the steps of:
providing an optical data store containing a data storage layer comprising a light sensitive material, wherein the light-sensitive material is embedded in a matrix material, the matrix material having a softening point that lies below a threshold temperature at which the data storage layer is destroyed, wherein the data storage layer has photo-inducible non-reversible anisotropy, wherein the induction of said photo-inducible non-reversible anisotropy requires a threshold value of the optical intensity to be exceeded, and wherein the data storage layer carries data represented by variations of the photo-inducible anisotropy; and
heating the matrix material to a temperature above the softening point so as to erase the data by diffusely blurring the data during the heating step.

12. The method of erasing data as claimed in claim 11, wherein the light-sensitive material contains bacteriorhodopsin.

13. The method of erasing data as claimed in claim 11, wherein the light-sensitive material is a photochromic material.

14. The method of erasing data as claimed in claim 11, wherein the matrix material is heated by infrared radiation.

15. The method of erasing data as claimed in claim 11, wherein the matrix material is heated by microwave radiation.

16. The method of erasing data as claimed in claim 11, wherein said light-sensitive material is an organic or biological polymer which is non-toxic and biodegradable.

* * * * *